US009987925B1

(12) United States Patent
Huang et al.

(10) Patent No.: US 9,987,925 B1
(45) Date of Patent: Jun. 5, 2018

(54) DISPLAY DEVICE FOR VEHICLES

(71) Applicant: JET OPTOELECTRONICS CO., LTD., Taipei (TW)

(72) Inventors: Terry Hsiao-Yang Huang, Taipei (TW); Tai-Hao Wen, Taipei (TW)

(73) Assignee: JET OPTOELECTRONICS CO., LTD., Taipei (TW)

( * ) Notice: Subject to any disclaimer, the term of this patent is extended or adjusted under 35 U.S.C. 154(b) by 0 days. days.

(21) Appl. No.: 15/498,126

(22) Filed: Apr. 26, 2017

(51) Int. Cl.
G06F 1/16 (2006.01)
B60K 35/00 (2006.01)
H05K 5/02 (2006.01)
H05K 5/00 (2006.01)

(52) U.S. Cl.
CPC ........... B60K 35/00 (2013.01); H05K 5/0017 (2013.01); H05K 5/0204 (2013.01); H05K 5/0226 (2013.01); B60K 2350/106 (2013.01); B60K 2350/922 (2013.01)

(58) Field of Classification Search
CPC .. H05K 5/0204; H05K 5/0217; H05K 5/0247; H05K 5/0017; H05K 5/0226; G06F 1/1681; G06F 1/1632; G06F 1/1654; F16M 11/041; F16M 11/06; F16M 11/12; F16M 11/121
See application file for complete search history.

(56) References Cited

U.S. PATENT DOCUMENTS

| | | | | |
|---|---|---|---|---|
| 2008/0245935 A1* | 10/2008 | Kaneda | ................ | F16M 11/041 248/206.2 |
| 2009/0015731 A1* | 1/2009 | Nagami | .............. | B60R 11/0235 348/837 |
| 2011/0174952 A1* | 7/2011 | Huang | ................. | F16M 11/041 248/371 |
| 2012/0075788 A1* | 3/2012 | Moscovitch | ......... | F16M 11/041 361/679.21 |
| 2014/0376182 A1* | 12/2014 | Motoishi | ................ | F16M 11/10 361/679.55 |
| 2015/0076297 A1* | 3/2015 | Parrill | .................. | F16M 11/041 248/176.3 |
| 2015/0138707 A1* | 5/2015 | Ho | ........................ | G06F 1/1601 361/679.21 |
| 2015/0311748 A1* | 10/2015 | Watanabe | .......... | B64D 11/0015 307/64 |
| 2016/0061379 A1* | 3/2016 | Watanabe | ............. | G06F 1/1656 224/191 |
| 2018/0027689 A1* | 1/2018 | Muldowney | .............. | B60R 1/00 |

* cited by examiner

*Primary Examiner* — Hoa C Nguyen
*Assistant Examiner* — Christopher L Augustin
(74) *Attorney, Agent, or Firm* — Li & Cai Intellectual Property (USA) Office

(57) ABSTRACT

A display device for vehicles is provided. The display device includes: a base, a connecting assembly and a display module. The connecting assembly is disposed on the base by a hinge. The hinge has a pivot of which the center is defined as a central axis. A connecting groove is disposed on the back side of the display module, such that the display module can be connected to the base when the connecting assembly is slidingly inserted into the connecting groove. The connecting assembly can slide in the opposite direction to be removed from the connecting groove of the display module.

11 Claims, 12 Drawing Sheets

DISPLAY DEVICE FOR VEHICLES

BACKGROUND

1. Technical Field

The present disclosure is related to a display device for vehicles, and in particular, to a display device that is adapted to be mounted to a vehicle roof.

2. Description of Related Art

The structure of conventional car roof display devices are generally designed such that a screen is mounted to a base and fixed to an inside surface of the car roof. However, the base of conventional display devices is quite large and occupies lots of space. Besides, most conventional screens and bases are fixedly connected together by connecting structures, such that the screen cannot be detached from the base, which causes inconvenience for upgrading or changing of screens.

Therefore, there is still room for improvement in the design of the conventional car roof display devices.

SUMMARY

The object of the present disclosure is to provide a display device for mounting at an inside roof of a vehicle. The display device according to the present disclosure includes a base for mounting at the inside roof, a connecting module and a display module.

The connecting module includes a connecting assembly and a hinge, wherein the connecting assembly is connected to the base through the hinge, the hinge has a pivot of which the center is defined as a central axis, the connecting assembly is connected to an end away from the pivot of the hinge, and the connecting assembly rotates back and forth between a first position adjacent to the inside roof and a second position away from the inside roof around the central axis. The display module has a front side and a back side opposite to the front side, in which a display panel is disposed at the front side, a connecting groove is disposed at the back side, and in which the connecting groove has an open end located at one end of the connecting groove and corresponding to one side of the display module. The connecting assembly enters into the connecting groove from the open end of the connecting groove. In addition, the connecting assembly moves back and forth along a direction parallel to the central axis, such that the connecting groove and the connecting assembly are detachably connected, and such that the display module is detachably connected to the connecting assembly and rotates back and forth along the connecting assembly between the first position and the second position.

In one embodiment of the display device provided by the present disclosure, the connecting groove is a recessed groove disposed at the back side of the display module, the connecting groove has a groove bottom and two side walls parallel to the central axis. Further, the connecting assembly has a body with which the connecting groove slidingly engages, in which the body has a top surface corresponding to the groove bottom and two side surfaces corresponding to the two side walls of the connecting groove, the top surface of the body being close to the groove bottom and the two side surfaces of the body being respectively close to the two side walls of the connecting groove when the body of the connecting assembly is inserted into the connecting groove.

In one embodiment of the display device provided by the present disclosure, the two side walls respectively have an engaging edge extending towards the central part of the connecting groove, two sides of the top surface of the body respectively have a protruding edge, and the two protruding edges respectively engage the two engaging edges when the body of the connecting assembly is inserted into the connecting groove, such that the connecting assembly and the connecting groove are connected to each other.

In one embodiment of the display device provided by the present disclosure, when the display module is at the second position, a side of the display module adjacent to the inside roof is defined as an upper side, and a side of the display module away from the inside roof is defined as a lower side. The connecting groove is disposed at the back side of the display module between the upper side and the lower side, and a first distance between the connecting groove and the central axis is larger than a second distance between the connecting groove and the upper side.

In one embodiment of the display device provided by the present disclosure, the display device further includes a first positioning member disposed between the base and the connecting module, in which the first positioning member fixes the connecting assembly and the display module at the first position when the connecting assembly and the display module move to the first position.

In one embodiment of the display device provided by the present disclosure, the first positioning member includes: a sliding member, an engaging member, and a first spring. The sliding member is slidably disposed on the base, the first spring is disposed between the sliding member and the base to keep the sliding member at a fixed position, and the engaging member is engaged to the connecting module so as to fix the connecting module at the first position when the sliding member is at the fixed position and the connecting member is at the first position.

In one embodiment of the display device provided by the present disclosure, the engaging member is disposed at an end adjacent to the connecting assembly of the sliding member, the engaging member has a hook disposed at a side facing the connecting module, and the connecting module has a recess disposed correspondingly to the hook. When the connecting module is at the first position, the hook snaps into the recess to fix the connecting module at the first position. The first positioning member further includes an abutting member through which the hook is detached from the recess by pushing the sliding member.

In one embodiment of the display device provided by the present disclosure, the display device further includes a second positioning member disposed between the connecting assembly and the connecting groove of the display module, such that the connecting groove and connecting assembly are undetachable from each other when the connecting groove is connected to the connecting assembly.

In one embodiment of the display device provided by the present disclosure, a positioning groove is disposed at one of the two engaging edges of the connecting groove. The second positioning member includes a slidable engaging member that is disposed slidably in the connecting assembly and has an engaging portion protruding from one side towards the positioning groove and penetrating a hole on the side of the body. When the connecting groove and the connecting assembly are connected together, the engaging portion engages the positioning groove to fix the connecting groove and the connecting assembly in position.

In one embodiment of the display device provided by the present disclosure, the second positioning member further includes a second spring disposed between the slidable engaging member and the connecting assembly for abutting the slidable engaging member such that the engaging portion protrudes out of the connecting assembly. The second positioning member further includes a protruding block disposed at the bottom surface of the second positioning member, wherein the protruding block passes through a through hole and protrudes out from the bottom surface of the connecting assembly.

In one embodiment of the display device provided by the present disclosure, a first connector is disposed at the body of the connecting assembly, a second connector is disposed corresponding to the first connector in the connecting groove. When the connecting assembly is inserted into the connecting groove, the first connector and the second connector are connected to each other.

The display device for vehicles according to the present disclosure can be mounted at any suitable location on an inside roof of a vehicle, and can be easily detached from or mounted on the base. In addition, convenience for upgrading or changing the display module can be increased.

In order to further understand the techniques, means and effects of the present disclosure, the following detailed descriptions and appended drawings are hereby referred to, such that, and through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
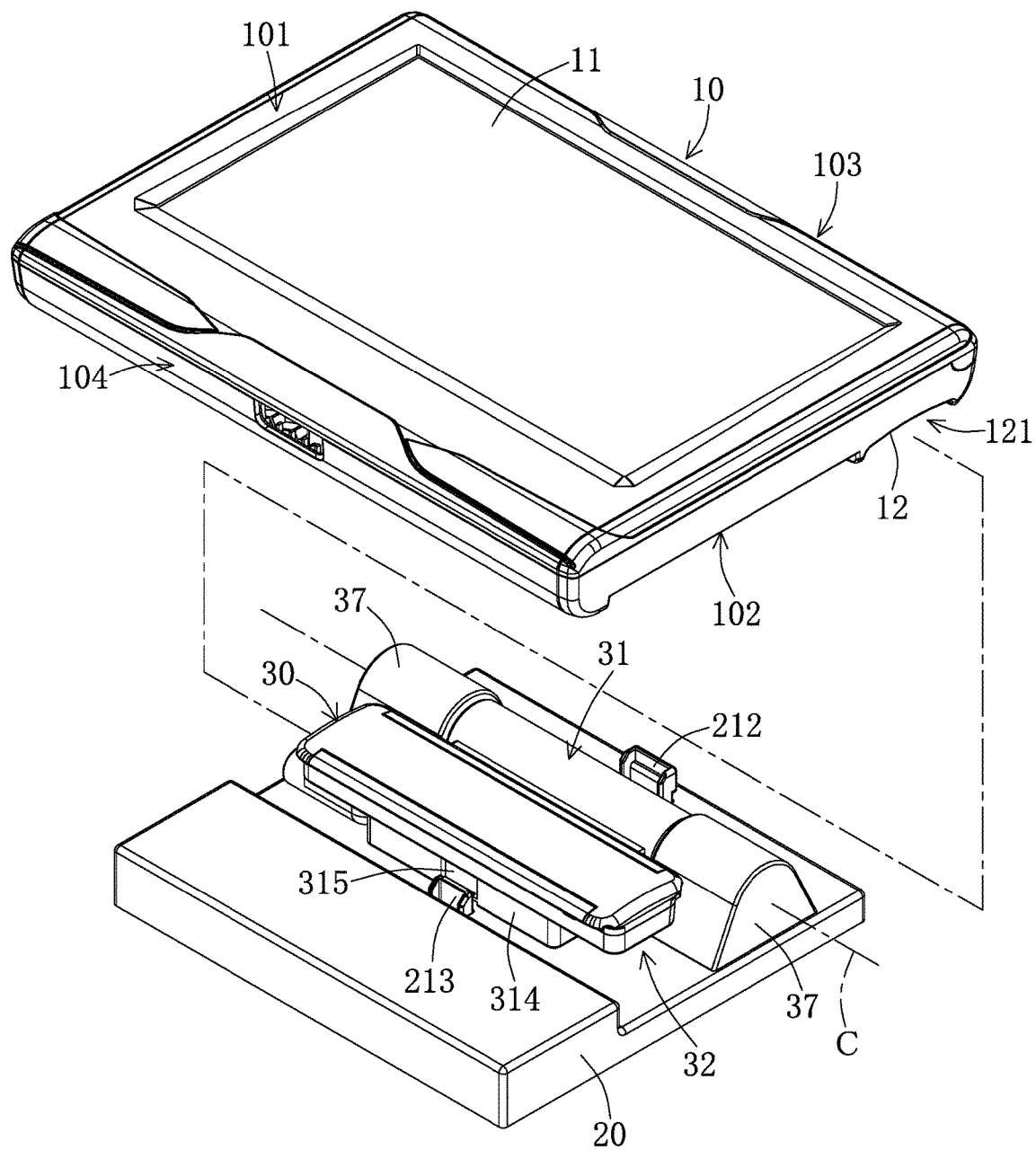
FIG. 1 is a diagram of a display device according to the present disclosure in which a display module and a base are separated.

Reference will now be made in detail to the exemplary embodiments of the present disclosure, examples of which are illustrated in the accompanying drawings. Wherever possible, the same reference numbers are used in the drawings and the description to refer to the same or like parts.

Figure 2:
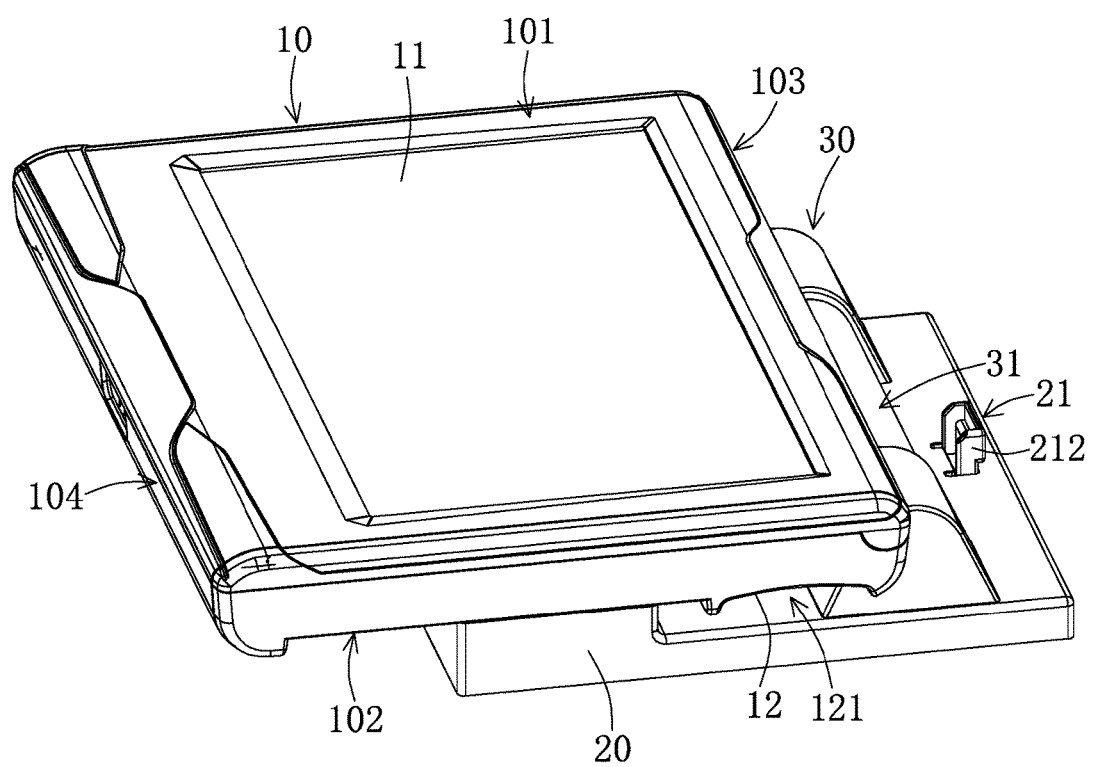
FIG. 2 shows a diagram of the display device according to the present disclosure in which the display module and the base are assembled.
Figure 10:
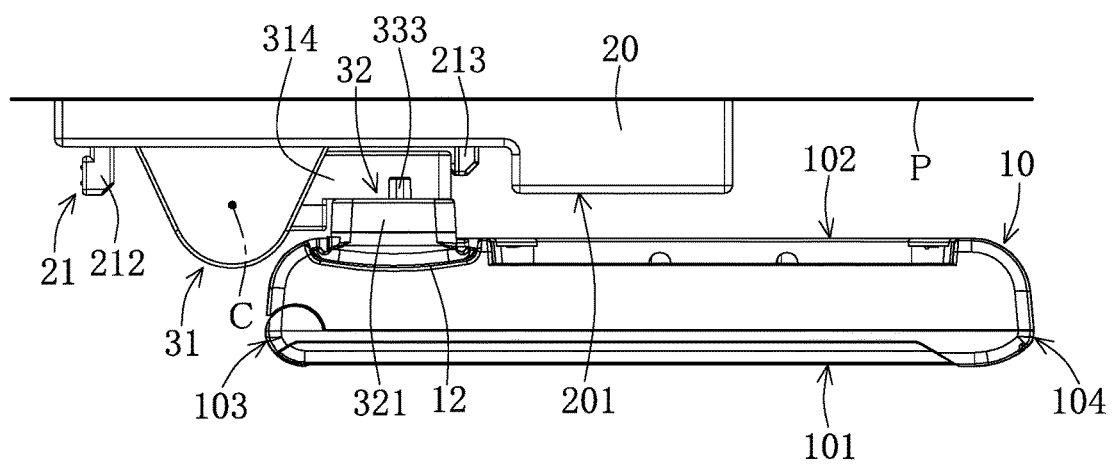
FIG. 10 to FIG. 12 are schematic diagrams showing in series the rotating movement of the display module of the display device according to the present disclosure.
Figure 11:
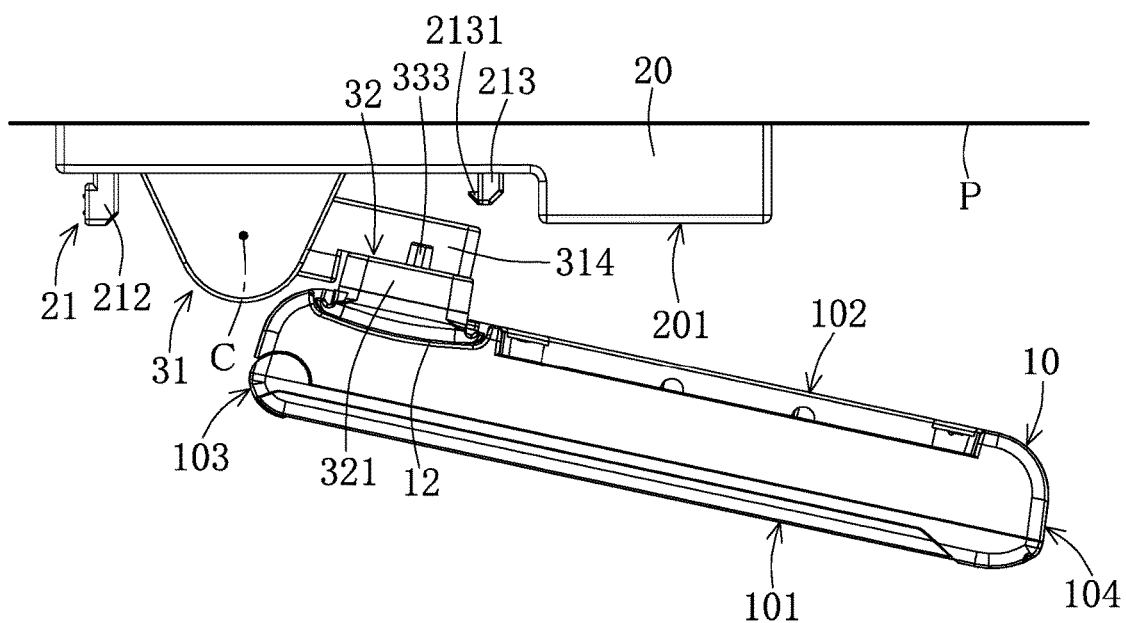
Figure 12:
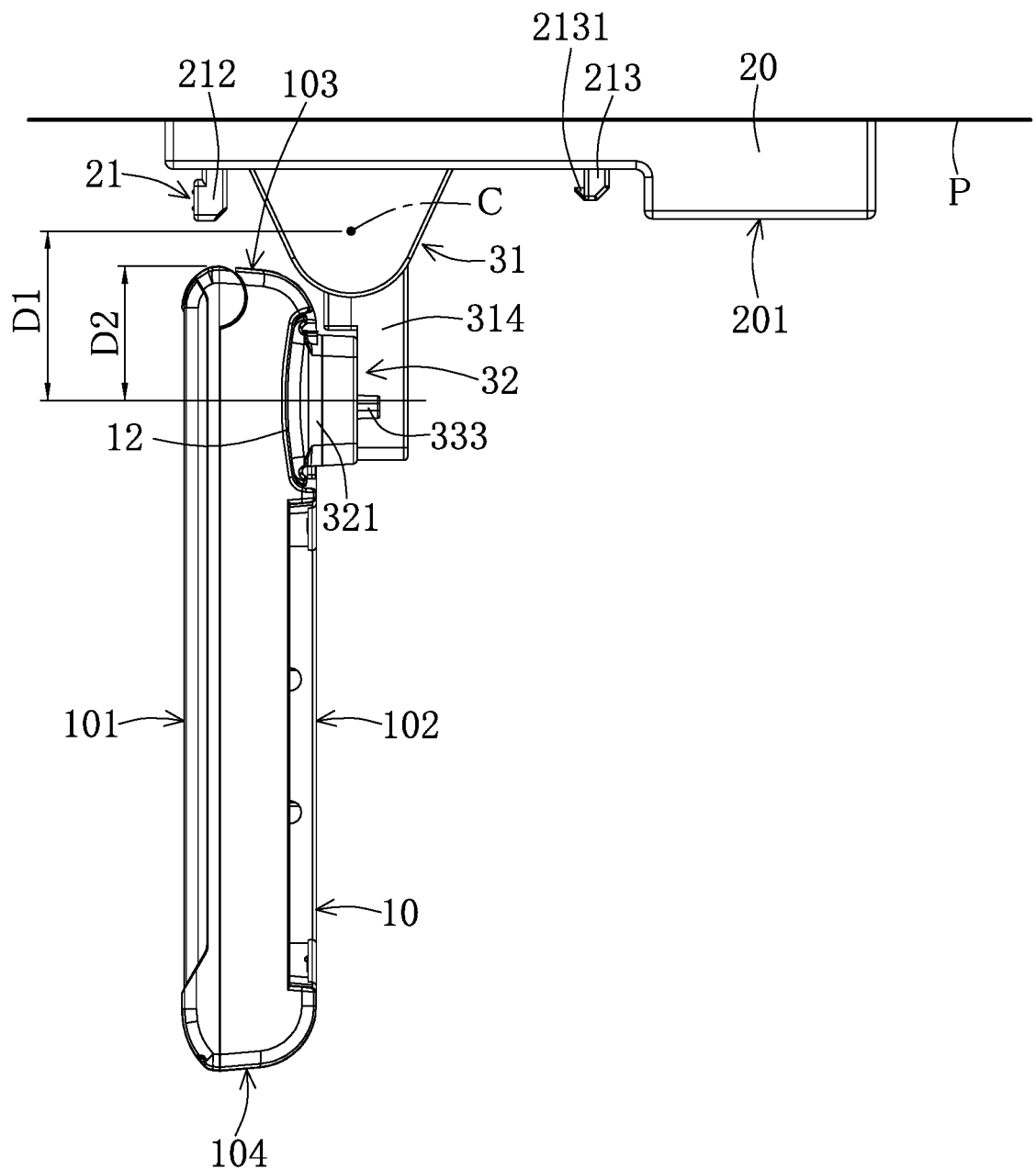

Referring to FIG. 1 and FIG. 2, the display device of the present disclosure includes a display module 10, a base 20 and a connecting module 30 disposed on the base 20. The base 20 is disposed on the inside roof P of a vehicle (as shown in FIG. 10 to FIG. 12), the connecting module 30 is disposed on the base 20 and includes a hinge 31 and a connecting assembly 32 connected to the hinge 31. The display module 10 is detachably connected to the connecting assembly 32 and is rotatable by the hinge 31 when mounted on the base 20.

Figure 6:
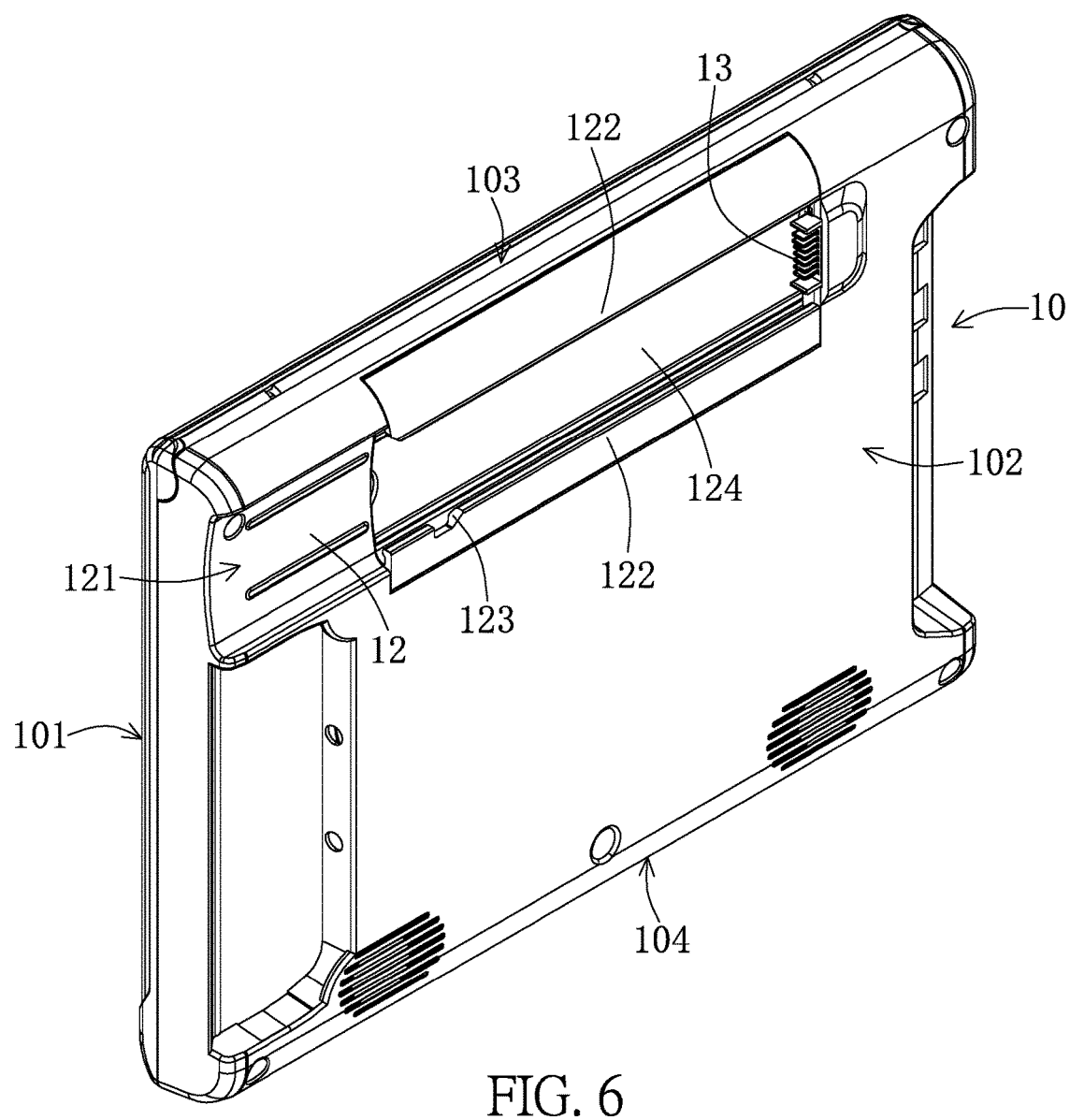
FIG. 6 is a diagram of the display module from the back side according to the present disclosure.

As shown in FIGS. 1, 2 and 6, the display module 10 has a front side 101 and a back side 102 opposite to the front side 101, and a connecting groove 12 is disposed at the back side 102 of the display module 10 to fit into the connecting assembly 32, so that the display module 10 can be detachably mounted on the base 20 through the connecting module 30.

As shown in FIGS. 2 and 10-12, the display module 10 can be connected to multimedia players or computers through the connecting module 30 so that videos and audios can be output by the display panel 11 of the display module 10. In addition, the superior tilt angle of the display panel 11 for watching videos can be achieved by adjusting the rotation angle of the display module 10 through the hinge 31 of the connecting module 30.

Moreover, independent power supply systems (such as batteries) can be disposed in the display module 10, such that the display module 10 remains powered even if detached from the base 20, turning into a portable tablet.

Figure 3:
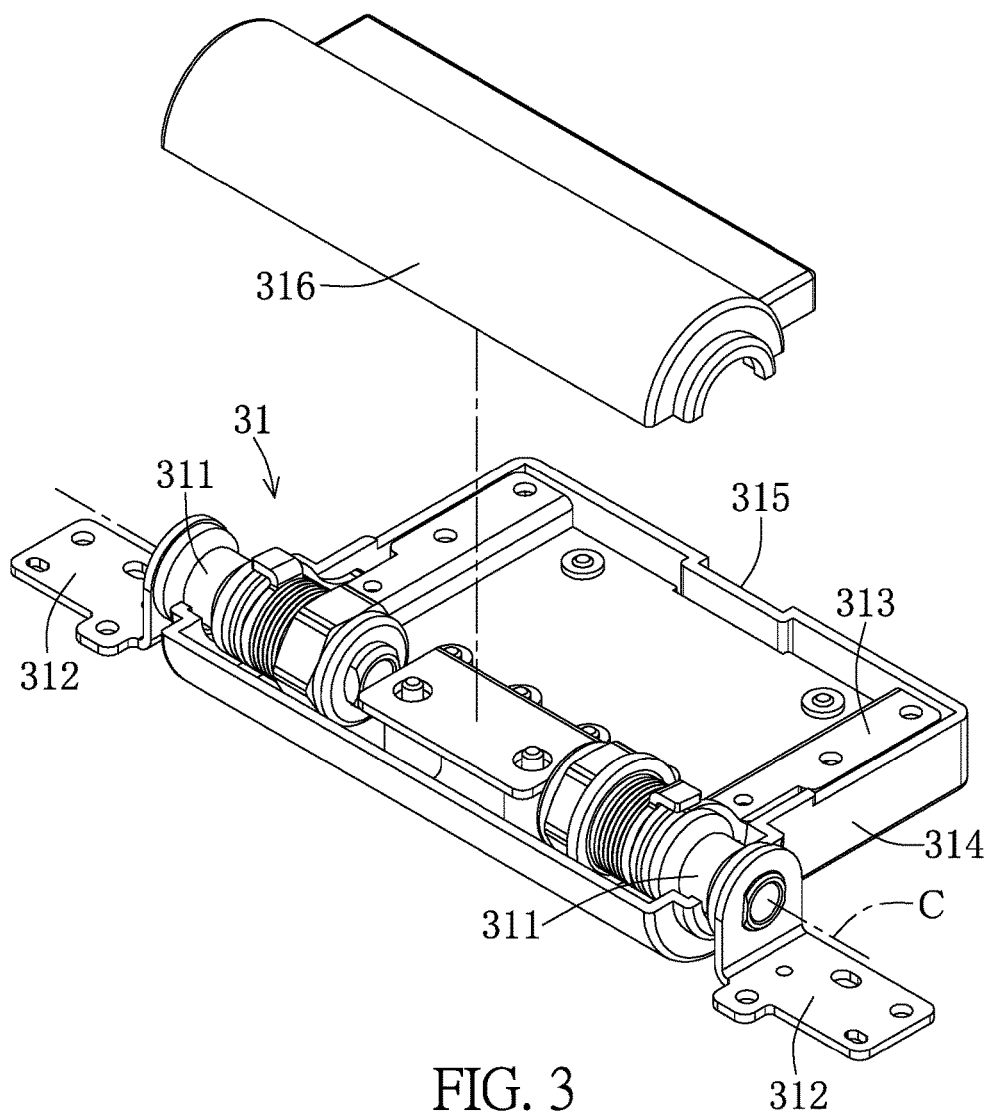
FIG. 3 shows a diagram of a connecting module according to the present disclosure.

As the connecting module 30 according to the present disclosure, the hinge 31 has two pivots 311 which are screwed on the base 20 through two fixing members 312 respectively. In addition, as referring to FIGS. 3 to 5, the center of the pivots 311 are positioned at a central axis C by two fixing members 312. The connecting module 30 further includes a connecting member 313, with one end of the connecting member 313 being connected to the pivot 311, and the other end of the connecting member 313 being connected to connecting assembly 32. In an embodiment of the present disclosure, as shown in FIG. 3, the connecting member 313 is a metal stamping member, with one end of the connecting member 313 being connected to the pivot 311. The pivot 311 is configured with crimp springs and fixing nuts to adjust the friction between the connecting member 313 and the pivot 311, so that the connecting member 313 has an optimal friction force when rotating on the pivot 311. The connecting module 30 further includes a lower casing body 314, an upper casing body 316 and two hinge caps 37. The lower casing body 314 and the upper casing body 316 are relatively disposed at the bottom and top of the connecting module 30 respectively, and the two hinge caps 37 are respectively disposed at the outside of the two pivots 311 of the hinge 31 to cover internal parts of the connecting module 30 for aesthetical considerations.

The connecting member 32 is fixed to an end opposite to the pivot 311 of the connecting member 313 of the hinge 31 by screwing, so that the connecting assembly 32 can rotate back and forth around the central axis C of the pivot 311 (with the connecting member 313 as the rotating arm). As shown in FIG. 10, when the display module 10 of the present disclosure is in an non-used state, the display module 10 and the hinge 31 of the connecting module 30 are adjusted to be level, so that the back side 102 of the display module 10 abuts against the inside roof P. Therefore, the configuration of the display module 10 and the connecting module 30 is defined as a first position. As shown in FIG. 12, in a used state, the display module 10 is rotated downward by the hinge 31 until reaching a position where the display module 10 is nearly perpendicular to the inside roof P. Hence, the configuration of the display module 10 and the connecting module 30 is defined as a second position.

Referring to FIGS. 1, 2 and 12, when the display module 10 is at the second position, one side of the display module 10 adjacent to the inside roof P is defined as an upper side 103, and one side of the display module 10 away from the inside roof P is defined as a lower side 104. As shown in FIG. 6, the connecting groove 12 is disposed at the back side 102 of the display module 10 and between the upper side 103 and the lower side 104. In addition, as the display module 10 is connected to the connecting module 30, both the upper side 103 and the lower side 104 of the display module 10, and the direction of the connecting groove 12, are parallel to the central axis C of the pivot 311 of the hinge 31. Therefore, the display module 10 can be retracted by rotating on the central axis C of the hinge 31.

Figure 4:
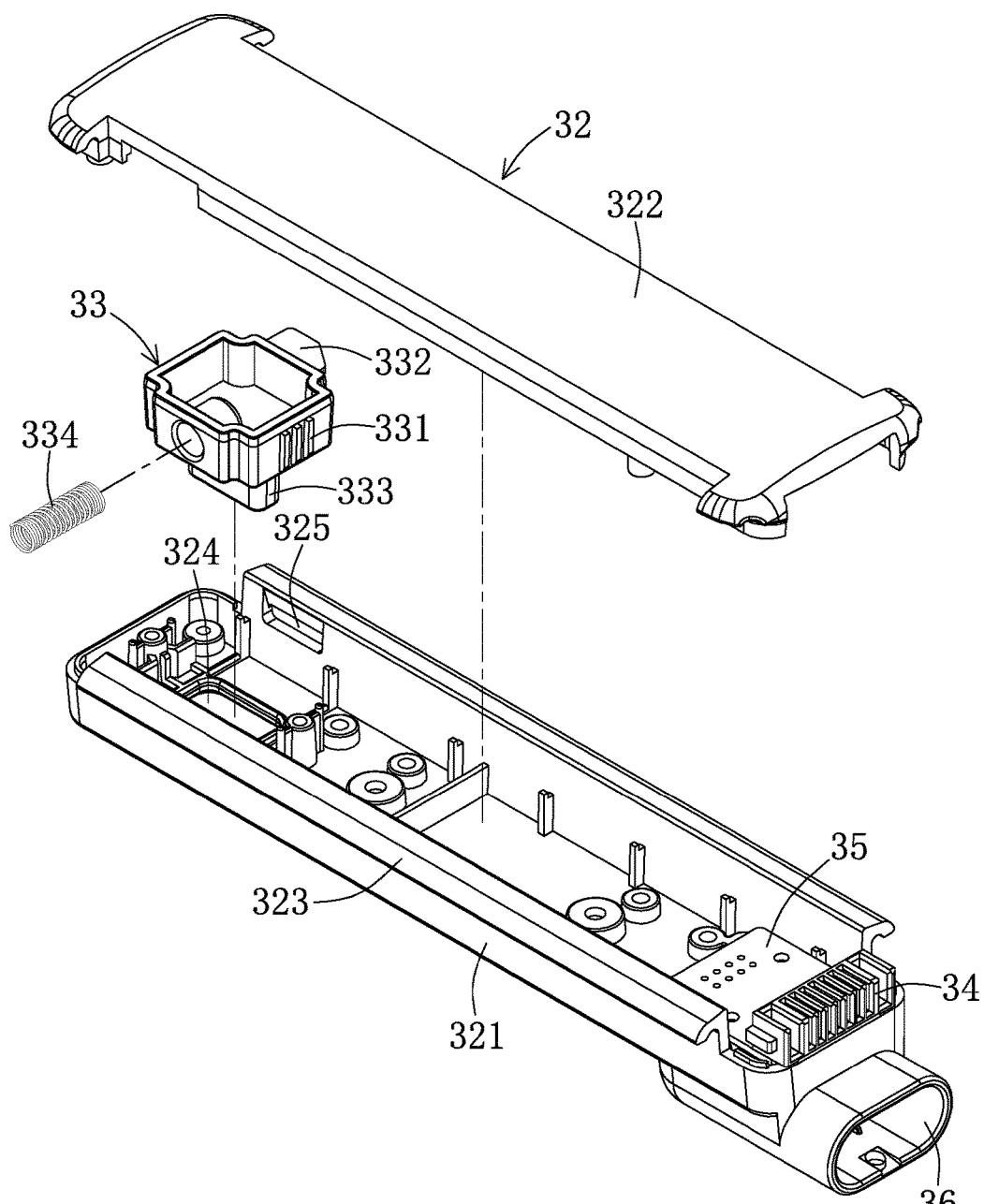
FIG. 4 is a diagram of a connecting assembly according to the present disclosure.
Figure 5:
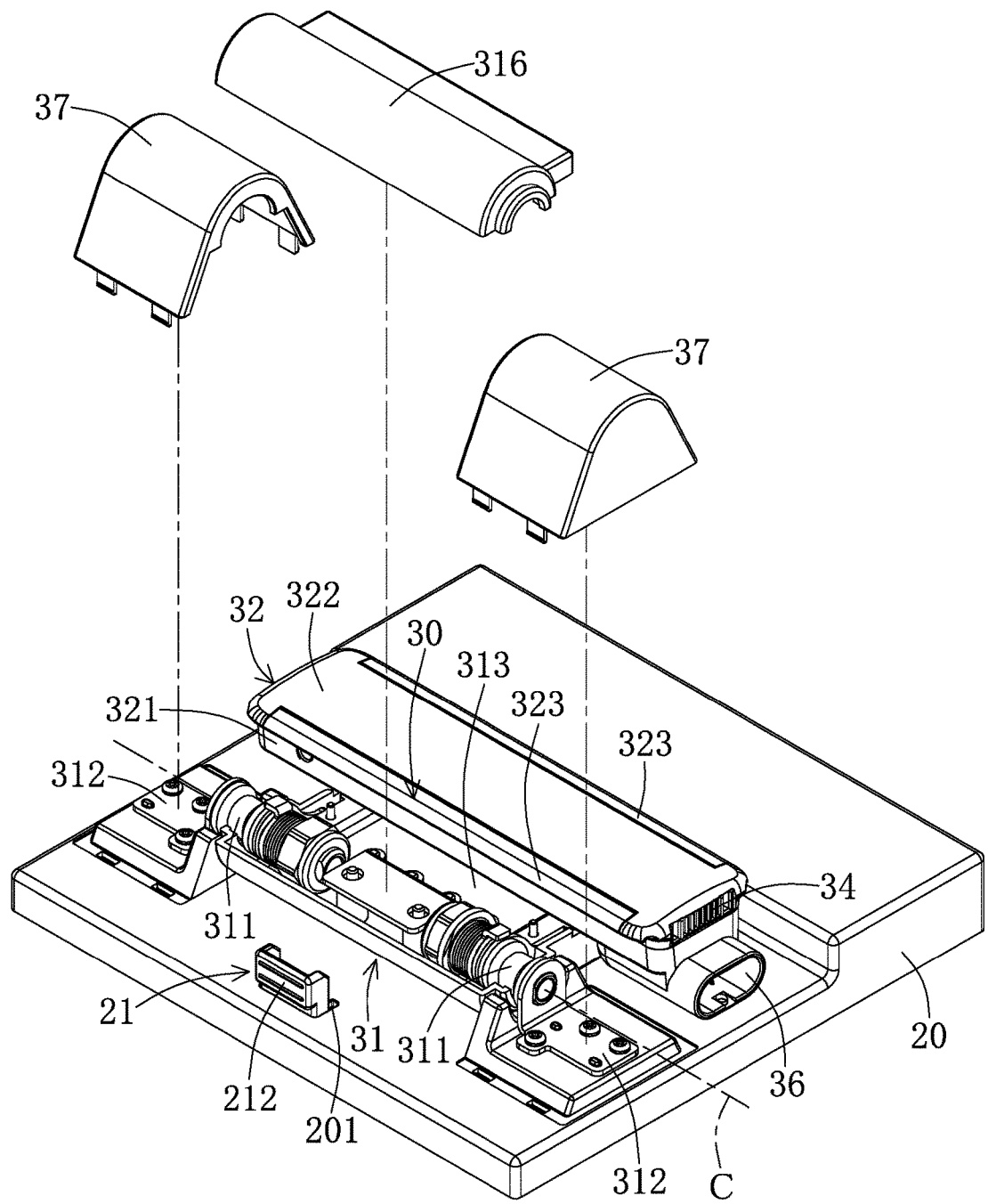
FIG. 5 is a partly exploded assembled perspective view showing the connecting module and the base according to the present disclosure with a cap of the connecting module being partially removed.
Figure 9:
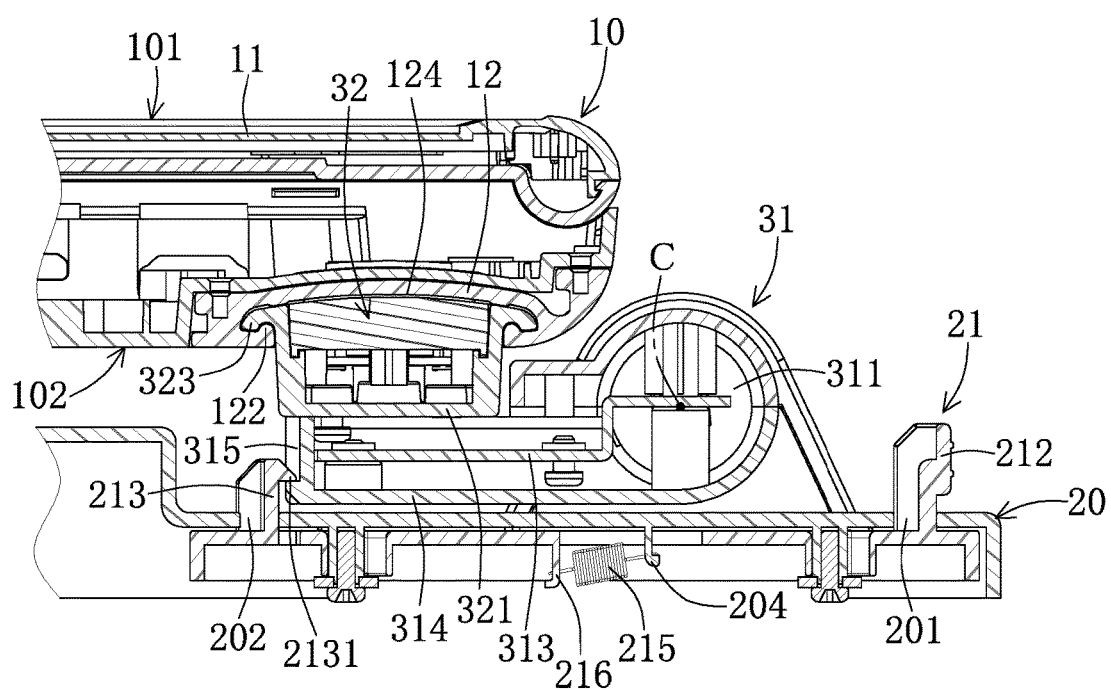
FIG. 9 is an enlarged fragmentary sectional view showing the connection between the connecting assembly and the connecting groove of the display module according to the present disclosure.

As shown in FIG. 6, the connecting groove 12 is a recessed groove disposed at the back side 102 of the display module 10. The connecting groove 12 is disposed at the back side 102 of the display module 10 along the direction parallel to the central axis C. The connecting groove 12 has an open end 121 that is disposed correspondingly at a side of the display module, so that the connecting groove 12 is able to slide along and engage with the connecting assembly 32 through the open end 121. As shown in FIGS. 6 and 9, the connecting groove has a groove bottom 124 and two side walls parallel to the central axis C. Referring to FIGS. 4 and 5, the connecting assembly 32 has a body 321. According to one embodiment, the shape and the size of the body 321 corresponds to the connecting groove 12, so that the connecting groove 12 and the body 321 of the connecting assembly 32 can engage with each other.

Figure 7:
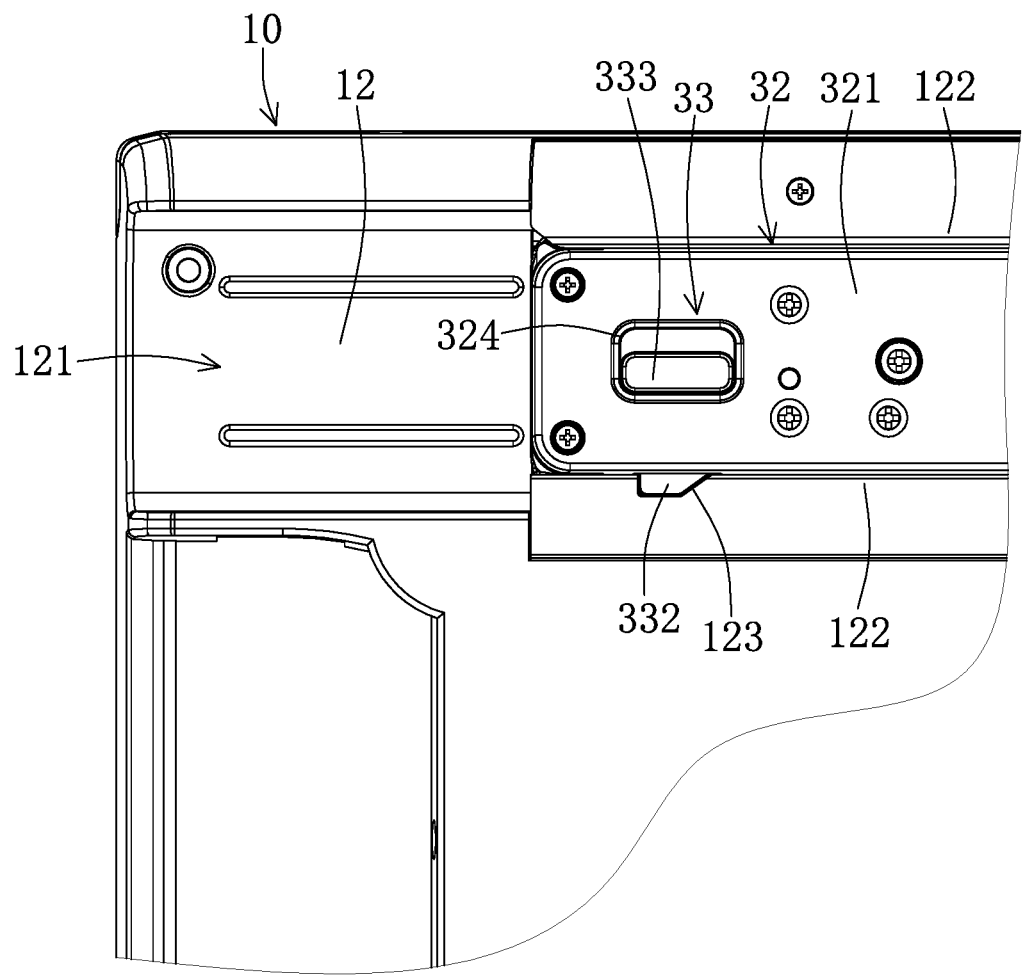
FIG. 7 shows a partial diagram of the display module and the connecting assembly in a connecting state according to the present disclosure.

Referring to FIGS. 4 and 9, a side of the body 321 of the connecting assembly 32 facing the groove bottom 124 of the connecting groove 12 is defined as an upper surface, and the other surface of the body 321 opposite to the groove bottom 124 is defined as a lower surface. The connecting assembly 32 has a cap 322 disposed on the top of the body 321, and the cap 322 seals the upper opening of the body 321 to form the upper surface of the body 321. As shown in FIG. 7, when the body 321 is inserted into the connecting groove 12, the upper surface of the body 321 faces the groove bottom 124 of the connecting groove 12, and the two sides of the body 321 are respectively close to the two side walls of the connecting groove 12.

As shown in FIGS. 4, 6 and 7, in order for the body 321 of the connecting assembly 32 to engage stably with the connecting groove 12, an engaging edge 122 extending towards the central part of the connecting groove 12 is disposed on the two side walls of the connecting groove 12. In addition, a protruding edge 323 is disposed on each of the two sides of the upper surface of the body 321. When the connecting assembly 32 and the connecting groove 12 are engaged, the two protruding edges 323 can be individually engaged to the side of the two engaging edges 122 facing the groove bottom 124, so that the body 321 cannot be separated from the connecting groove 12, and the display module 10 can be connected to the connecting module 30.

As shown in FIGS. 5 and 6, a first connector 34 is disposed at the body 321 of the connecting assembly 32, and a second connector 13 is disposed at an end opposite the open end 121 of the connecting groove 12 on the back side 102 of the display module 10. The first connector 34 corresponds to the second connector 13. The first connector 34 can be electrically connected to the second connector 13 when the body 321 is inserted into the connecting groove 12. A circuit board 35 is disposed on the connecting assembly 32, and the first connector 34 is electrically connected to the circuit board 35, by which the first connector 34 can be electrically connected to multimedia players or computers of vehicles. Therefore, video and audio signals can be transmitted to and output by the display module 10 via the electrical connection between the multimedia players or computers and the display module 10 through the circuit board 35, the first connector 34 and the second connector 13.

In addition, a socket 36 having signal and power contacts is disposed at the end of the body 321 of the connecting assembly 32, so as to transmit and/or receive electrical signals and power.

The present disclosure further includes a first positioning member 21 disposed on the base 20. The first positioning member 21 is used for fixing the connecting assembly 32 and the display module 10 at the first position when the connecting assembly 32 and the display module 10 move to the first position.

Figure 8:
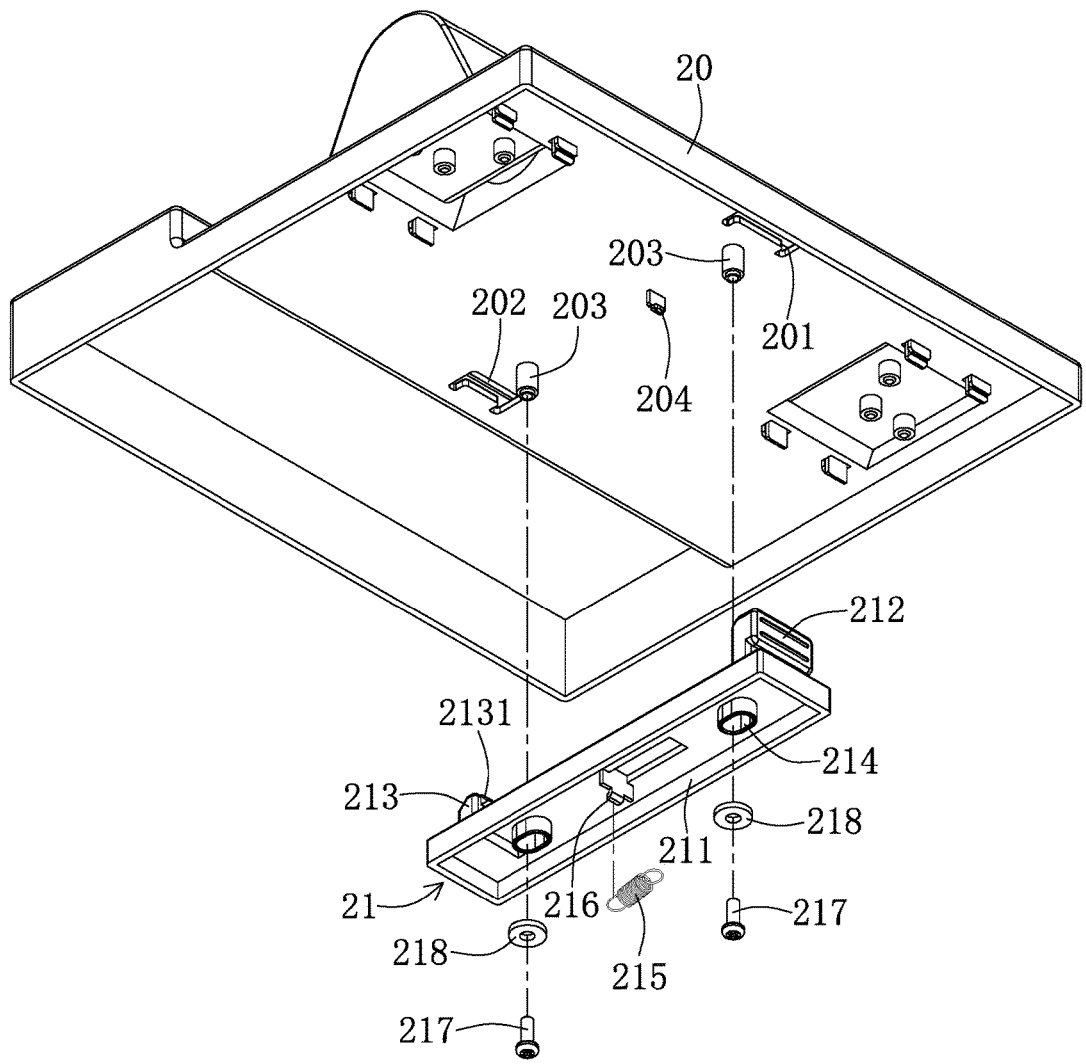
FIG. 8 is a diagram of the base and a first positioning member according to the present disclosure.

As shown in FIGS. 1, 8 and 9, the first positioning member 21 includes: a sliding member 211, an engaging member 213, an abutting member 212 and a first spring 215. The sliding member 211 is rectangular-shaped and slides back and forth along a straight line when disposed at the side of the base 20 opposite to the connecting module 30. Referring to FIG. 8, two oval holes 214 are disposed at the sliding member 211, and two cylinders 203 are respectively disposed at the side of the base opposite to the connecting module 30 and correspond to each of the two oval holes 214. The two cylinders 203 can individually insert into the two oval holes 214. Further, the screws 217 and the screw washers are further screwed at the bottom surface of the two cylinders 203 to fix the two oval holes 214 of the sliding member 211. The two cylinders 203 can slide in and move relative to the two oval holes 214, so that the sliding member 211 can slide back and forth along a straight path when guided.

The first spring 215 connects between the sliding member 211 and the base 20. The sliding member 211 can be kept at a fixed position in which the engaging member 213 and the connecting module 30 maintain engagement to each other. Referring to FIGS. 8 and 9, a first hook portion 204 is disposed on a side opposite to the connecting module 30 of the base 20, a second hook portion 216 is disposed on the bottom surface of the sliding member 211, and the two ends of the first spring 215 connect between the first hook portion 204 and the second hook portion 216. The first hook portion 204 and the second hook portion 216 are gravitated toward each other through the elasticity of the first spring 215, so as to keep the sliding member 211 at the fixed position.

The engaging member 213 and the abutting member 212 are respectively disposed on each end of the sliding member 211, and the engaging member 213 and the abutting member 212 respectively pass through a first through hole 201 and a second through hole 202 on the base 20 to the side of the base 20 adjacent to the connecting module 30. The engaging member 213 has a hook 2131 disposed at a side thereof facing the connecting module 30, and the lower casing body 314 of the connecting module 30 has a recess 315 disposed correspondingly to the hook 2131. When the connecting module 30 is at the first position, the hook 2131 can snap into the recess 315 to fix the connecting module 30 at the first position and to keep the display module 10 abutted against the inside roof P.

The abutting member 212 is disposed at the end of the engaging member 213 opposite to the sliding member 211. Users can push the abutting member 212 with his/her fingers to move the sliding member 211 and the engaging member 213. As shown in FIG. 11, when a user wishes to adjust the display module 10 from the first position (as shown in FIG. 10) to the second position (as shown in FIG. 12), the first positioning member 21 can be pushed so that the sliding member 211 and the engaging member 213 are pushed away from the fixed position, thereby detaching the hook 2131 of the engaging member 213 from the recess 315. Therefore, the connecting module 30 can rotate toward the second position without restriction from the hook 2131.

Further, the top of the hook 2131 of the engaging member 213 is a slope. When the display module 10 and the connecting module 30 are pushed back to the first position, the front edge of the lower casing body 314 of the connecting module 30 contacts firstly the slope of the top of the hook 2131, then pushes the hook 2131 and the engaging member 213 away from the fixed position until the connecting module 30 rotates to the first position. Afterwards, the hook 2131 and the recess 315 align with each other, which causes the hook 2131 to fit into the recess 315 again.

In addition, a second positioning member 33 is disposed between the display module 10 and the connecting assembly 32 to position the connecting assembly 32 to the connecting groove 12 of the display module 10, so that the connecting assembly 32 cannot detach from the connecting groove 12 after being inserted therein. Therefore, the display module 10 can be fixed stably on the connecting module 30 without the risk of detachment under normal circumstances.

As shown in the FIGS. 4, 6 and 7, the second positioning member 33 includes a slidable engaging member 331. The slidable engaging member 331 is disposed slidably in the body 321 of the connecting assembly 32. The slidable engaging member 331 has an engaging portion 332 disposed on the side facing the positioning groove 123. A hole 325 is disposed on a side of the body 321 of the connecting assembly 32 corresponding to the engaging portion 332, so that the engaging portion 332 passes through the hole 325 and protrudes out of the side of the body 321. In addition, a second spring 334 is disposed between the slidable engaging member 331 and the inside wall of the body 321. The slidable engaging member 331 can be pushed toward the positioning groove 123 through the elasticity of the second spring 334, so that the engaging portion 332 keeps protruding from the side of the body 321.

In addition, as shown in FIGS. 6 and 7, a positioning groove 123 disposed on one of the engaging edges 122 of the connecting groove 12 of the display module 10, the positioning groove 123 and the engaging portion 332 being disposed correspondingly and fittingly with each other. Hence, the body 321 of the connecting assembly 32 inserts into the connecting groove 12, so that the engaging portion 332 and the positioning groove 123 align with each other, and the engaging portion 332 is snapped into the positioning groove 123.

After the engaging portion 332 of the second positioning member 33 is snapped into the positioning groove 123 of the connecting groove 12, the connecting assembly 32 can be restricted to the connecting groove 12, so as to keep the display module 10 fixed stably on the connecting module 30, thereby preventing falling of the display module 10 due to vibrations of the vehicle.

In addition, a protruding block 333 is further disposed at the bottom surface of the slidable engaging member 331, and a through hole 324 is disposed at the position corresponding to the protruding block 333 of the bottom surface of the body 321. The protruding block 333 passes through the through hole 324 and protrudes out from the bottom surface of the body 321. Users can toggle the protruding block 333 with their fingers to push the slidable engaging member 331 of the second positioning member 33 away from the engaging portion 332 so that the engaging portion 332 and the positioning groove 123 are separated from each other, thereby detaching the body 321 of the connecting assembly 32 from the connecting groove 12.

Referring to FIGS. 10 to 12, which show the rotating movement of the display module of the display device in series according to the present disclosure, the display module 10 rotates around the central axis C of the hinge 31 and moves back and forth between the first position and the second position after being connected to the connecting module 30. In the present disclosure, the connecting module 30 is connected to the back side 102 of the display module 10. In order to prevent the base 20 or the inside roof P from interfering with the rotation of the display module 10, the positional relationship between the connecting module 30 and the display module 10 need be further specified as follows. The connecting groove 12 is disposed at the back side 102 and between the upper side 103 and the lower side 104 of the display module 10. When the display module 10 is at the second position, the first distance D1 between the connecting groove 12 and the central axis C of the pivot 311 is larger than the second distance D2 between the connecting groove 12 and the upper side 103. In other words, when the display module 10 is at the second position, the upper side 103 of the display module 10 is at a lower level than that of the central axis C of the pivot 311. In this manner, the upper side 103 of the display module 10 can be prevented from contacting with the base 20 or the inside roof In summary, the display device for vehicles according to the present disclosure can be mounted at any suitable location on inside roofs of vehicles by the base 20, which is smaller in size than bases for most conventional vehicle display devices, so as to occupy less space and be mounted more easily. In addition, the display module 10 of the display device can be conveniently detached from or mounted on the base 20, and can be used individually as a portable screen or stored away when not being used. Last but not the least, the display module 10 and the connecting module 30 are connected together by the connecting groove 12, which increases convenience for upgrading or changing the display module 10.

The descriptions illustrated supra set forth simply the preferred embodiments of the present invention; however, the characteristics of the present invention are by no means restricted thereto. All changes, alterations, or modifications conveniently considered by those skilled in the art are deemed to be encompassed within the scope of the present invention delineated by the following claims.

What is claimed is:

1. A display device for mounting at an inside roof of a vehicle, comprising:
   a base for being mounted at the inside roof;
   a connecting module including a connecting assembly and
     a hinge, wherein the connecting assembly is connected to the base by the hinge, the hinge has a pivot of which the center is defined as a central axis, the connecting assembly is connected to an end away from the pivot of the hinge, and the connecting assembly rotates back and forth between a first position adjacent to the inside roof and a second position away from the inside roof around the central axis;

a display module having a front side and a back side opposite to the front side, wherein a display panel is disposed at the front side, a connecting groove is disposed at the back side, and wherein the connecting groove has an open end located at one end of the connecting groove and corresponding to one side of the display module; and a first positioning member disposed between the base and the connecting module, wherein the first positioning member fixes the connecting assembly and the display module at the first position when the connecting assembly and the display module move to the first position;

wherein the connecting assembly enters into the connecting groove from the open end of the connecting groove; and wherein the connecting assembly moves back and forth along a direction parallel to the central axis, such that the connecting groove and the connecting assembly are detachably connected, and such that the display module is detachably connected to the connecting assembly and rotates back and forth along the connecting assembly between the first position and the second position;

wherein the first positioning member includes: a sliding member, an engaging member, and a first spring, wherein the sliding member is slidably disposed on the base, the first spring is disposed between the sliding member and the base to keep the sliding member at a fixed position, the engaging member is engaged to the connecting module so as to fix the connecting module at the first position when the sliding member is at the fixed position and the connecting member is at the first position.

2. The display device according to claim 1, wherein the connecting groove is a recessed groove disposed at the back side of the display module, the connecting groove has a groove bottom and two side walls parallel to the central axis; wherein the connecting assembly has a body with which the connecting groove slidingly engages, and wherein the body has a top surface corresponding to the groove bottom and two side surfaces corresponding to the two side walls of the connecting groove, the top surface of the body being close to the groove bottom and the two side surfaces of the body being respectively close to the two side walls of the connecting groove when the body of the connecting assembly is inserted into the connecting groove.

3. The display device according to claim 2, wherein the two side walls respectively have an engaging edge extending towards the central part of the connecting groove, two sides of the top surface of the body respectively have a protruding edge, and the two protruding edges respectively engage the two engaging edges when the body of the connecting assembly is inserted into the connecting groove, such that the connecting assembly and the connecting groove are connected to each other.

4. The display device according to claim 1, wherein when the display module is at the second position, a side of the display module adjacent to the inside roof is defined as an upper side, and a side of the display module away from the inside roof is defined as a lower side; wherein the connecting groove is disposed at the back side of the display module between the upper side and the lower side, and a first distance between the connecting groove and the central axis is larger than a second distance between the connecting groove and the upper side.

5. The display device according to claim 1, wherein the engaging member is disposed at an end adjacent to the connecting assembly of the sliding member, the engaging member has a hook disposed at a side facing the connecting module, and the connecting module has a recess disposed correspondingly to the hook, when the connecting module is at the first position, the hook snaps into the recess to fix the connecting module at the first position; and wherein the first positioning member further includes an abutting member by which the hook is detached from the recess when the abutting member pushes the sliding member.

6. The display device according to claim 3, further including a second positioning member disposed between the connecting assembly and the connecting groove of the display module, such that the connecting groove and connecting assembly are undetachable from each other when the connecting groove is connected to the connecting assembly.

7. The display device according to claim 6, wherein a positioning groove is disposed at one of the two engaging edges of the connecting groove; and wherein the second positioning member includes a slidable engaging member, wherein the slidable engaging member is disposed slidably in the connecting assembly and has an engaging portion protruding from one side towards the positioning groove and passing through a hole on the side of the body, and when the connecting groove and the connecting assembly are engaged, the engaging portion engages the positioning groove to fix the connecting groove and the connecting assembly in position.

8. The display device according to claim 7, wherein the second positioning member further includes a second spring disposed between the slidable engaging member and the connecting assembly for abutting and pushing against the slidable engaging member such that the engaging portion protrudes out of the connecting assembly, wherein the second positioning member further includes a protruding block disposed at the bottom surface of the second positioning member, and wherein the protruding block passes through a through hole and protrudes out from the bottom surface of the connecting assembly.

9. The display device according to claim 2, wherein a first connector is disposed at the body of the connecting assembly, a second connector is disposed corresponding to the first connector in the connecting groove, and when the connecting assembly is inserted into the connecting groove, the first connector and the second connector are connected to each other.

10. A display device for mounting at an inside roof of a vehicle, comprising:

a base for being mounted at the inside roof;

a connecting module including a connecting assembly and a hinge, wherein the connecting assembly is connected to the base by the hinge, the hinge has a pivot of which the center is defined as a central axis, the connecting assembly is connected to an end away from the pivot of the hinge, and the connecting assembly rotates back and forth between a first position adjacent to the inside roof and a second position away from the inside roof around the central axis;

a display module having a front side and a back side opposite to the front side, wherein a display panel is disposed at the front side, a connecting groove is disposed at the back side, and wherein the connecting groove has an open end located at one end of the connecting groove and corresponding to one side of the display module;

a second positioning member disposed between the connecting assembly and the connecting groove of the display module, such that the connecting groove and connecting assembly are undetachable from each other when the connecting groove is connected to the connecting assembly;

wherein the connecting assembly enters into the connecting groove from the open end of the connecting groove; and wherein the connecting assembly moves back and forth along a direction parallel to the central axis, such that the connecting groove and the connecting assembly are detachably connected, and such that the display module is detachably connected to the connecting assembly and rotates back and forth along the connecting assembly between the first position and the second position;

wherein the connecting groove is a recessed groove disposed at the back side of the display module, the connecting groove has a groove bottom and two side walls parallel to the central axis; wherein the connecting assembly has a body with which the connecting groove slidingly engages, and wherein the body has a top surface corresponding to the groove bottom and two side surfaces corresponding to the two side walls of the connecting groove, the top surface of the body being close to the groove bottom and the two side surfaces of the body being respectively close to the two side walls of the connecting groove when the body of the connecting assembly is inserted into the connecting groove;

wherein the two side walls respectively have an engaging edge extending towards the central part of the connecting groove, two sides of the top surface of the body respectively have a protruding edge, and the two protruding edges respectively engage the two engaging edges when the body of the connecting assembly is inserted into the connecting groove, such that the connecting assembly and the connecting groove are connected to each other;

wherein a positioning groove is disposed at one of the two engaging edges of the connecting groove; and wherein the second positioning member includes a slidable engaging member, wherein the slidable engaging member is disposed slidably in the connecting assembly and has an engaging portion protruding from one side towards the positioning groove and passing through a hole on the side of the body, and when the connecting groove and the connecting assembly are engaged, the engaging portion engages the positioning groove to fix the connecting groove and the connecting assembly in position.

11. The display device according to claim 10, wherein the second positioning member further includes a second spring disposed between the slidable engaging member and the connecting assembly for abutting and pushing against the slidable engaging member such that the engaging portion protrudes out of the connecting assembly, wherein the second positioning member further includes a protruding block disposed at the bottom surface of the second positioning member, and wherein the protruding block passes through a through hole and protrudes out from the bottom surface of the connecting assembly.

* * * * *